United States Patent
Dolan et al.

(10) Patent No.: US 10,453,673 B2
(45) Date of Patent: Oct. 22, 2019

(54) REMOVAL OF METAL

(71) Applicant: MICRON TECHNOLOGY, INC., Boise, ID (US)

(72) Inventors: Brian Dolan, Boise, ID (US); Robert J. Hanson, Boise, ID (US); Chan Lim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 15/867,993

(22) Filed: Jan. 11, 2018

(65) Prior Publication Data
US 2018/0138033 A1     May 17, 2018

Related U.S. Application Data

(62) Division of application No. 15/070,456, filed on Mar. 15, 2016, now Pat. No. 9,887,077, which is a division of application No. 13/044,134, filed on Mar. 9, 2011, now Pat. No. 9,293,319.

(51) Int. Cl.
*H01L 21/02* (2006.01)
*H01L 21/66* (2006.01)

(52) U.S. Cl.
CPC ........ *H01L 21/02071* (2013.01); *H01L 22/12* (2013.01); *H01L 22/20* (2013.01)

(58) Field of Classification Search
None
See application file for complete search history.

(56) References Cited

U.S. PATENT DOCUMENTS

| | | |
|---|---|---|
| 6,143,476 A | 11/2000 | Ye et al. |
| 2001/0006245 A1 | 7/2001 | Yunogami et al. |
| 2002/0060202 A1 | 5/2002 | Fukunaga et al. |
| 2004/0202593 A1 | 10/2004 | Phillips et al. |
| 2008/0121249 A1 | 5/2008 | Gatineau et al. |
| 2008/0152793 A1 | 6/2008 | Gatineau et al. |

FOREIGN PATENT DOCUMENTS

| | | |
|---|---|---|
| JP | 0878396 A | 3/1996 |
| WO | 2009085561 A2 | 7/2009 |

*Primary Examiner* — Eric W Golightly
(74) *Attorney, Agent, or Firm* — Dicke, Billig & Czaja, PLLC

(57) ABSTRACT

Methods of removing metal from a portion of a substrate include exposing the substrate to a reducing environment comprising at least one reducing agent and at least one oxidizing agent, determining whether metal remaining on the portion of the substrate is less than or equal to a particular level, and exposing the substrate to an oxidizing environment comprising at least one oxidizing agent and at least one reducing agent if the metal remaining on the portion of the substrate is deemed to be greater than the particular level.

20 Claims, 4 Drawing Sheets

REMOVAL OF METAL

RELATED APPLICATIONS

This Application is a Divisional of U.S. application Ser. No. 15/070,456, titled "REMOVAL OF METAL," filed Mar. 15, 2016 ,now U.S. Pat. No. 9,887,077, issued on Feb. 6, 2018, which is a Divisional of U.S. application Ser. No. 13/044,134, titled "REMOVAL OF METAL," filed Mar. 9, 2011, now U.S. Pat. No. 9,293,319, issued on Mar. 22, 2016, which are commonly assigned and incorporated herein by reference.

TECHNICAL FIELD

The present disclosure relates generally to cleaning surface layers in integrated circuit fabrication, and, in particular, in one or more embodiments, the present disclosure relates to the removal of metal from a substrate as part of fabrication of an integrated circuit device

BACKGROUND

The fabrication of integrated circuit devices generally involves a variety of patterned layers of semiconductor, insulator and conductor materials. This patterning is often carried out by a process of forming one or more thin layers of material followed by removing unwanted portions of the layers. Such removal is generally carried out by exposing portions of the layers to a liquid, gaseous or ionic etching agent to remove the exposed portions of the layers. The nature and composition of the etching agent used to remove the exposed portions of the layers is dependent upon the nature of layer to be removed as well as the nature of the surrounding layers to be retained.

A photolithographic process is often used to define the desired pattern. In a photolithographic process, a photoresist layer is formed on the surface of the in-process device. The photoresist layer contains a photo-sensitive polymer whose ease of removal is altered upon exposure to light or other electromagnetic radiation. To define the pattern, the photoresist layer is selectively exposed to radiation and then developed to expose portions of the underlying layer to be removed. In practice, a mask is placed between the photoresist layer and a light source or other radiation source. The mask contains a pattern of opaque and transparent sections to selectively block or transmit the radiation. In a positive resist system, the portions of the photoresist layer exposed to the radiation are photosolubilized and the mask is designed to block the radiation from those portions of the photoresist layer that are to remain after developing. In a negative resist systems, the portions of the photoresist layer exposed to the radiation are photopolymerized and the mask is designed to block the radiation from those portions of the photoresist layer that are to be removed by developing. While other processes are possible, in general a pattern is formed to define portions of a material to remove, and portions of the material to retain.

Removal processes are often not complete. That is, after patterning a layer of material, some trace contamination, e.g., unremoved material, may remain on the underlying surface. Such trace contamination is often the result of trying to mitigate damage to the underlying or adjacent structures from the removal process itself by subjecting these surrounding structures to the removal process only for a limited time. For example, it may be experimentally or empirically determined that a particular time is needed to remove a particular thickness of metal. Ideally then, if the removal process is performed for the particular time, it would be expected that the particular thickness of that metal would be removed and damage to surrounding materials would be mitigated by not subjecting them to the removal process for an unnecessary amount of time. However, given the variabilities of typical manufacturing conditions, some of the metal intended for removal may remain on underlying structures.

For the reasons stated above, and for other reasons stated below which will become apparent to those skilled in the art upon reading and understanding the present specification, there is a need in the art for alternative methods for removal of metals from substrates.

DETAILED DESCRIPTION

Figure 1A:
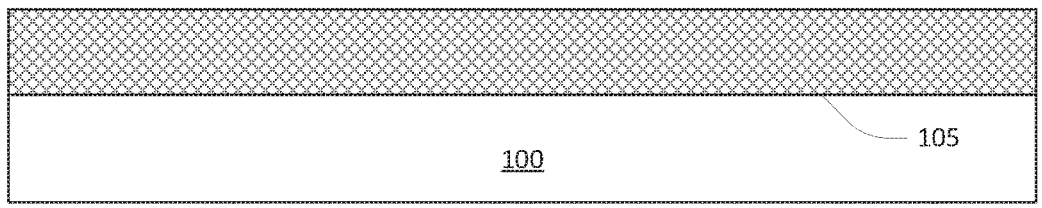
FIGS. 1A-1D depict a portion of an integrated circuit device during various stages of fabrication in accordance with an embodiment of the disclosure.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and chemical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

Various embodiments include methods of removing metal, such as ruthenium (Ru), osmium (Os) and iridium (Ir) from a substrate. The substrate may be one or more layers of a semiconductor structure used in the fabrication of an integrated circuit device, e.g., a field-effect transistor, a memory cell, a capacitor, a diode, etc. The methods include exposing the substrate to an oxidizing environment containing both an oxidizing agent and a reducing agent in an oxidizing stage, and then exposing the substrate to a reducing environment containing both a reducing agent and an oxidizing agent in a reducing stage. As is generally accepted, oxidation refers to the increase in oxidation state of a material, while reduction refers to a decrease in oxidation state of a material. While the description herein will refer to oxidized metal as metal oxides as a matter of convenience, it is to be understood that metal may be oxidized by elements other than oxygen, e.g., chlorine or fluorine.

The oxidizing environment of the oxidizing stage tends to oxidize the unwanted metal, while the reducing agent of the oxidizing environment is believed to facilitate passivation of surrounding metal structures to be retained. This is possible given the relative ratio of mass to surface area of the metals to be removed versus the ratio of mass to surface area of the metals to be retained, i.e., the metals to be removed are expected to have significantly lower mass for a given surface area, thus making them more susceptible to oxidation as a percent of total mass. An additional benefit of the reducing agent may be to improve ashing of organic residuals. For example, removal processes for patterning a metal layer can often produce undesirable metal-organic residuals, e.g., as might be produced by an interaction with a photolithographic mask, or photoresist. By improving the ashing of these organic residuals, improved removal of metal in the form of metal-organic residuals may also be facilitated.

Oxidation can result in removal of some of the unwanted metals. Using ruthenium as an example, oxidation of elemental ruthenium using an oxygen-containing oxidizing agent will generally result in the formation of both ruthenium dioxide ($RuO_2$) and ruthenium tetraoxide ($RuO_4$). Ruthenium tetraoxide is volatile, such that metal removal will result. However, ruthenium dioxide is a solid, and will tend to remain attached to the substrate. In addition, ruthenium dioxide can be fairly difficult to remove. Various embodiments address this issue by seeking to reduce the ruthenium dioxide back to elemental ruthenium using the reducing stage.

The reducing environment of the reducing stage can tend to reduce unwanted metal oxides (i.e., unwanted metals in increased oxidation states), while the oxidizing agent of the reducing environment is believed to facilitate passivation of surrounding structures. Using ruthenium dioxide as an example, reduction of the ruthenium dioxide will generally result in the formation of elemental ruthenium. However, where at least a portion of the ruthenium subjected to the oxidizing stage was vaporized as ruthenium tetraoxide, the ruthenium formed as a result of reducing the ruthenium dioxide will represent a reduction in the amount of unwanted ruthenium existing before oxidation. Various embodiments can then repeat the cycle of oxidizing/reducing stages until the level of unwanted metals (or unwanted metal oxides) is at or below a particular value, e.g., until the amount of unwanted metals remaining is deemed to be acceptable for proper operation of the integrated circuit device under formation, or until the amount of unwanted metals is below a level of detection.

FIGS. 1A-1D depict a portion of an integrated circuit device during various stages of fabrication in accordance with an embodiment of the disclosure. FIG. 1A depicts a substrate 100 having a metal 105 formed thereon. In one example, the substrate 100 may represent a gate dielectric of a field-effect transistor to be fabricated and the metal 105 may represent a control gate of that field-effect transistor. Alternatively, the substrate 100 may represent a dielectric of a capacitor to be fabricated and the metal 105 may represent an electrode of that capacitor. As another example, the substrate 100 may represent a dielectric of a memory cell, such as a gate or other dielectric, and the metal 105 may represent a charge trap of the memory cell. In general, however, substrate 100 represents one or more layers of a semiconductor structure used in the fabrication of an integrated circuit device.

The metal 105 represents a metal having, at a particular temperature and pressure, a volatile oxidation state and a solid oxidation state. For example, ruthenium tetraoxide is volatile at 40° C. and atmospheric pressure, while ruthenium dioxide is solid at the same conditions. As another example, osmium tetraoxide ($OsO_4$) is volatile at 130° C. and atmospheric pressure, while osmium dioxide ($OsO_2$) is solid at the same conditions. In addition, iridium hexafluoride ($IrF_6$) is volatile at 53° C. at atmospheric pressure, while iridium pentafluoride ($IrF_5$) is solid at the same conditions. Other metals can also meet this particular provision. The following description will use the example of a ruthenium metal 105, but it will be understood that the described process can apply in a similar manner to other metals.

Figure 1B:
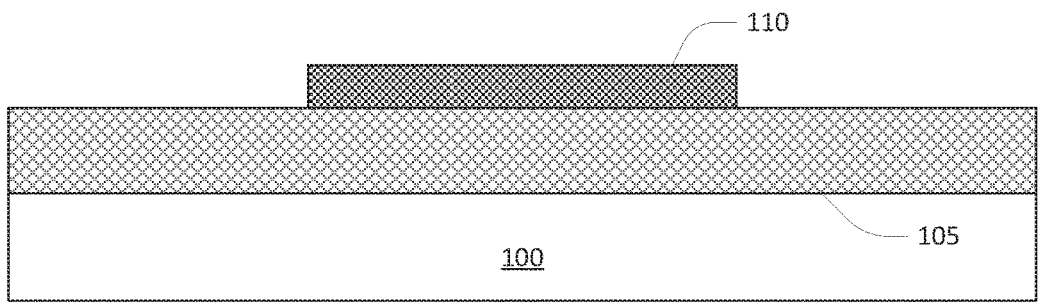
Figure 1C:
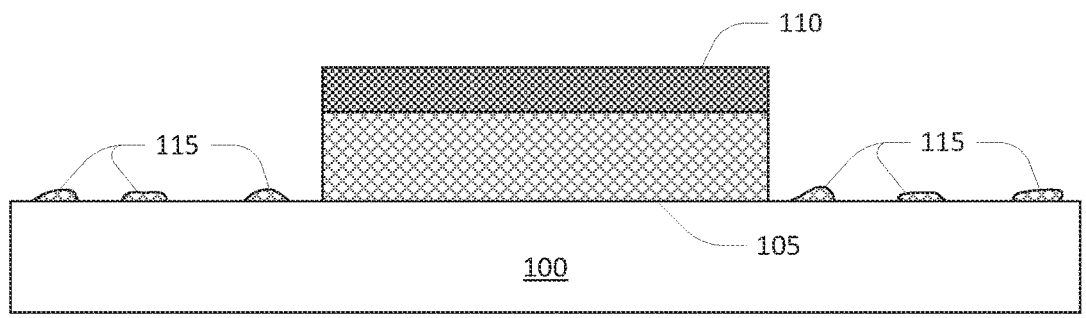

In FIG. 1B, a mask 110 is formed on the metal 105. The mask 110 defines areas of the metal 105 to be retained, i.e., that portion of metal 105 underlying the mask 110, and areas of the metal 105 to be removed, i.e., those portions of metal 105 not covered by mask 110. The mask 110 may be a photolithographic mask, for example. In FIG. 1C, portions of metal 105 are removed. For example, ruthenium may be removed by exposing the substrate 100 to a plasma containing oxygen and chlorine. As depicted in FIG. 1C, removal processes may not be complete, i.e., those portions of the metal 105 to be removed may not be completely removed. Areas of contamination 115, i.e., patches or traces of remaining metal, are shown to represent the metal 105 not removed by the removal process in the areas not covered by mask 110. It is noted that areas of contamination 115 are not intended to be drawn to scale or in a density expected from a given removal process. They merely signify that some metal 105 intended for removal may remain on the surface of the substrate 100 after patterning. Observed conditions following an oxygen/chlorine strip of ruthenium indicated ruthenium contamination levels on the order of 7E10 atoms/$cm^2$ in one example.

Figure 1D:
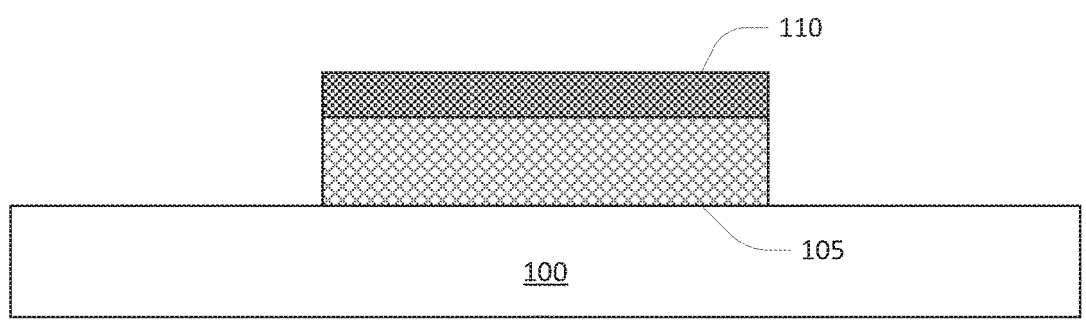

In FIG. 1D, the areas of contamination 115 are depicted to be removed. Removal is performed using a method in accordance with at least one embodiment of this disclosure. In particular, the areas of contamination 115 are removed using a method including at least one oxidizing stage and one reducing stage of various embodiments. While FIG. 1D shows all areas of contamination 115 to be removed, it is recognized in the realities of industrial processing that some areas of contamination 115 may remain. Thus, removal in FIG. 1D refers to a reduction in mass of the areas of contamination 115 from FIG. 1C, and does not require total removal, e.g., zero mass, of those areas of contamination 115. For at least one embodiment, the metal is removed to less than a detectable amount, e.g., less than 1E10 atoms/$cm^2$.

Figure 2:
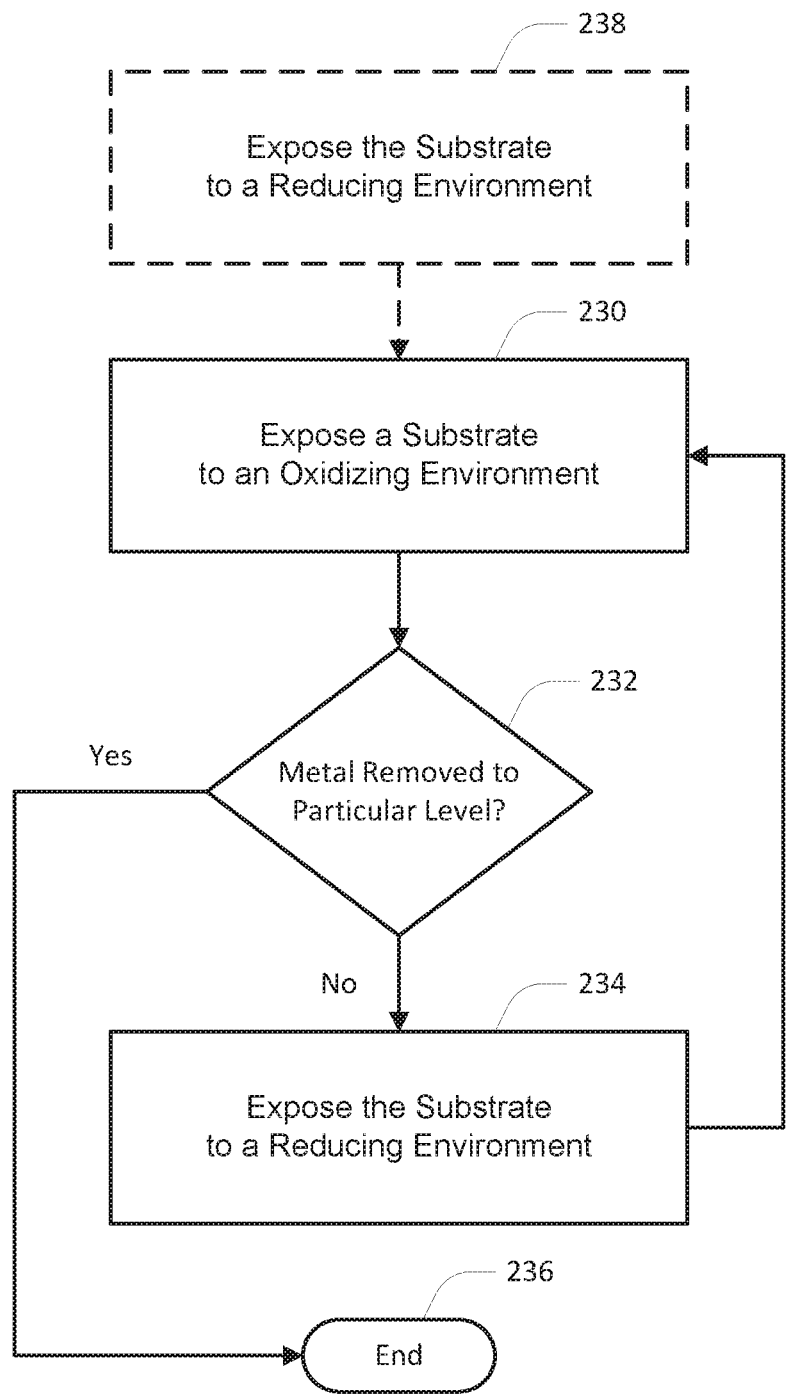
FIG. 2 is a flowchart of a method of removing metal in accordance with an embodiment of the disclosure.

FIG. 2 is a flowchart of a method of removing metal in accordance with an embodiment of the disclosure. At 230, a substrate is exposed to an oxidizing environment. The oxidizing environment includes both an oxidizing agent and a reducing agent. The levels of one or more oxidizing agents and one or more reducing agents in the oxidizing environment are such that the metal experiences a net increase in oxidation states as a result of the exposure. For one example, the oxidizing agent may contain elemental oxygen, e.g., oxygen ($O_2$), ozone ($O_3$), etc., or a halogen, e.g., chlorine ($Cl_2$), fluorine ($F_2$), $CHF_3$, $CF_4$, $NF_3$, $CH_2F_2$, etc. As a further example, the reducing agent may contain elemental hydrogen, e.g., hydrogen ($H_2$), ammonia ($NH_3$), forming gas (typically 3-20% $H_2$ with the remainder being nitrogen), etc. For certain embodiments, the oxidizing environment includes 60-99% $O_2$. For further embodiments, the oxidizing environment includes approximately 90% $O_2$. For certain embodiments, the oxidizing environment includes 0.4-20% $H_2$. For further embodiments, the oxidizing environment includes approximately 0.4% $H_2$. For certain embodiments, the remainder of the oxidizing environment includes an inert gas, such as nitrogen ($N_2$), helium (He), argon (Ar) or the like. For at least one embodiment, the oxidizing environment consists essentially of $O_2$, $H_2$ and $N_2$. For at least one embodiment, the oxidizing environment includes approximately 90% $O_2$, 0.4% $H_2$ and 9.6% $N_2$. As used herein, percentages of gases refer to volume percentages.

The oxidizing environment is expected to oxidize at least a portion of the metal on the substrate to a volatile oxidation state. A remaining portion may be oxidized to a solid oxidation state, or may be left unreacted, such as where oxidation formation on a surface of the metal hinders further oxidation of underlying metal. For various embodiments, the oxidizing environment is a gaseous environment. For further embodiments, the gaseous oxidizing environment is an oxidizing plasma. The substrate is exposed to the oxidizing environment at 230 for a particular time. The particular time may depend upon the metal to be removed and the particular oxidizing environment selected, e.g., the ease at which the metal to be removed is oxidized in the particular oxidizing environment. For at least one embodiment, the substrate may be exposed to the oxidizing environment for a time of 5-100 seconds. The particular time may vary depending upon the number of exposures. For example, the exposure time for a subsequent exposure to the oxidizing environment may be more or less than the exposure time for the preceding exposure to the oxidizing environment. The particular exposure times can be determined experimentally or empirically for a given metal and a given oxidizing environment.

At 232, a decision is made as to whether metal has been removed to at least a particular level. The particular level may be a specific measured amount. For example, surface analysis could be performed to determine an amount of unwanted metal remaining, either in its unreacted state or oxidized state. Alternatively, exhaust gases from the reaction to the oxidizing environment could be analyzed to determine an amount of volatile metal oxides being generated, with that amount being proportional to the amount of metals removed. However, a different approach could include simply counting a number of times the substrate has been exposed to the oxidizing environment, and deeming the metal to be removed to at least the particular level after the substrate has been exposed to the oxidizing environment for a particular number of times. For at least one embodiment, the particular number of times is 3 to 15, although fewer or more exposures to the oxidizing environment are possible depending upon the extent of removal desired. In a similar manner, the metal could be deemed to be removed to at least the particular level after the substrate has been exposed to the oxidizing environment for a particular total exposure time. For at least one embodiment, the particular total exposure time is 20-300 seconds, although less or more time exposed to the oxidizing environment is possible depending upon the extent of removal desired. For further embodiments, the decision may be based on a combination of number of exposures and total exposure time. As one example, the metal could be deemed to be removed to at least the particular level after the substrate has been exposed to the oxidizing environment at least three times and for at least 100 seconds of total exposure time. Such an embodiment may be beneficial where the exposure time is varied between exposures. The particular number of exposures and the particular total exposure time can be determined experimentally or empirically for a given metal and a given oxidizing and/or reducing environment.

If the metal has been deemed to be removed to at least particular level at 232, i.e., the level of metal is deemed to be less than or equal to the particular level, the process can end at 236. If the metal is not deemed to be removed to at least the particular level at 232, i.e., the level of metal is deemed to be greater than the particular level, the substrate is exposed to a reducing environment at 234.

The reducing environment includes both a reducing agent and an oxidizing agent. The levels of one or more reducing agents and one or more oxidizing agents in the reducing environment are such that the oxides of the metal experience a net decrease in oxidation states as a result of the exposure. For one example, the reducing agent may contain elemental hydrogen, e.g., hydrogen ($H_2$), ammonia ($NH_3$), forming gas (typically 3-20% $H_2$ with the remainder being nitrogen), etc. As a further example, the oxidizing agent may contain elemental oxygen, e.g., oxygen ($O_2$), ozone ($O_3$), etc., or a halogen, e.g., chlorine ($Cl_2$), fluorine ($F_2$), $CHF_3$, $CF_4$, $NF_3$, $CH_2F_2$, etc. For certain embodiments, the reducing environment includes 20-98% $NH_3$. For further embodiments, the reducing environment includes 30-50% $NH_3$. For certain embodiments, the reducing environment includes 2-65% $O_2$. For at least one embodiment, the reducing environment consists essentially of $NH_3$ and $O_2$. For at least one embodiment, the reducing environment includes approximately 38% $NH_3$ and 62% $O_2$.

The reducing environment is expected to transform at least a portion of oxidized metal on the substrate to its elemental form. A remaining portion may be transformed to a lower oxidation state, or may be left unreacted, such as where unreacted metal remains on the substrate following exposure to the oxidizing environment. For at least one embodiment, the reducing environment is a gaseous environment. For at least one embodiment, the gaseous reducing environment is a reducing plasma. The substrate is exposed to the reducing environment at 234 for a particular time. The particular time may depend upon the metal to be removed and the particular reducing environment selected, i.e., the ease at which the metal to be removed is brought to a lower oxidation state in the particular reducing environment. For at least one embodiment, the substrate may be exposed to the reducing environment for a time of 5-100 seconds. The particular time may vary depending upon the number of exposures. For example, the exposure time for a subsequent exposure to the reducing environment may be more or less than the exposure time for the preceding exposure to the reducing environment. The particular exposure times can be determined experimentally or empirically for a given metal and a given reducing environment.

It is noted that the exposure times for the oxidizing environment and the reducing environment may be independent. For example, for a particular oxidizing environment, the system may reach a steady-state condition quicker than its corresponding reducing environment, such that the exposure time at 230 might be chosen to be less than the exposure time at 234.

While the foregoing example started with exposure to an oxidizing environment, for alternate embodiments, the substrate could be exposed to a reducing environment at 238 prior to exposing the substrate to an oxidizing environment at 230. Such embodiments may be desirable where the metal to be removed is already in an increased oxidation state, such that reduction may be desired before oxidation. In addition, the determination at 232 could be moved subsequent to exposing the substrate to a reducing environment at 234, where a determination that the metal had not been removed to the particular level would instead cause the process to return to exposing the substrate to an oxidizing environment at 230. Furthermore, the order of the environments could be swapped. For example, 230 could represent exposing the substrate to a reducing environment, 234 could represent exposing the substrate to an oxidizing environment, and optional 238 could represent exposing the substrate to an oxidizing environment, with the determination at 232 being performed subsequent to 230 or 234.

Figure 3:
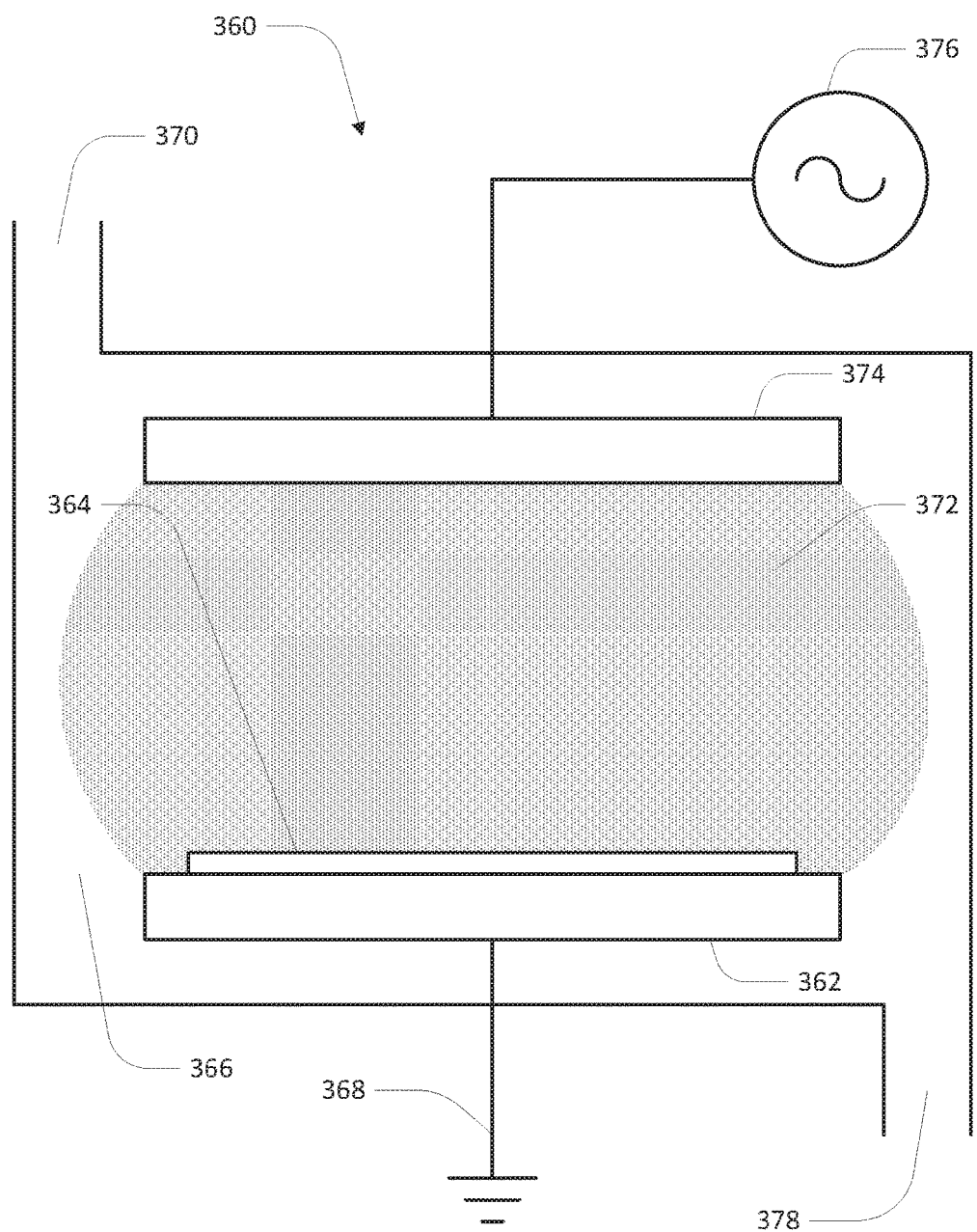
FIG. 3 is a schematic illustration of a reactor system suitable for use with embodiments of the disclosure.

FIG. 3 is a schematic illustration of a plasma reactor system 360 suitable for use with the embodiments of the disclosure. Those familiar with such apparatus will recognize that FIG. 3 is a simplified schematic, and that typical plasma reactor system may contain additional or alternate components. In general, any reactor system 360 capable of generating a plasma as described herein may be used with the various embodiments.

A first electrode 362, such as a conductive pedestal, supporting a semiconductor structure 364 is located in a chamber 366. The semiconductor structure 364 may represent a semiconductor wafer containing a substrate 100 and metal 105 as described with reference to FIGS. 1A-1D. The electrode 362 is typically connected to a ground node 368. A gas inlet 370 is provided for introduction of component gases into the chamber 366. The component gases make up the plasma 372. The component gases used to create the plasma 372, i.e., the oxidizing environment or the reducing environment, may generally be fed to the chamber 366 in a continuous manner during the operation of the reactor 360. For example, for the oxidizing environment, component gases including approximately 50-2800 sccm of forming gas (e.g., $N_2$ and $H_2$) and approximately 3000-7000 sccm of oxygen could be fed to the chamber 366 in a continuous manner to produce an oxidizing environment containing approximately 60-99% oxygen. As described herein, the oxidizing environment may contain other combinations of oxidizing agents and reducing agents. As a further example, for the reducing environment, component gases including approximately 1000-7000 sccm of ammonia and approximately 100-5500 sccm of oxygen could be fed to the chamber 366 in a continuous manner to produce a reducing environment containing approximately 20-98% ammonia. As described herein, the reducing environment may contain other combinations of reducing agents and oxidizing agents. For various embodiments, the total gas flow for each such environment may be on the order of 5000-7000 sccm. For a specific example, an oxidizing environment could be formed by feeding approximately 700 sccm of forming gas (e.g., $N_2$ and $H_2$) and approximately 6300 sccm of oxygen to the chamber 366 in a continuous manner to produce an oxidizing environment containing approximately 90% oxygen at a total gas flow of approximately 7000 sccm.

A second electrode 374 is located in the chamber 366 and is connected to a power source 376. A gas outlet 378 allows excess or spent gases to be removed from the chamber 366, such as by a vacuum pump (not shown). Excitation of the component gases within the chamber, such as through the application of RF (radio frequency) energy across the electrodes 374 and 362, can be used to generate the plasma 372. Although the system 360 is shown to use an alternating current power source for generation of the plasma 372, other sources of plasma are known, such as electron cyclotron resonance (ECR), reflected electron, helicon wave, inductively coupled plasma (ICP), microwave (MW), radio frequency (RF) and transformer coupled plasma (TCP).

Regardless of the source of the plasma, the plasma 372 is formed to be in contact with the surface of semiconductor structure 364, i.e., a substrate containing the metal to be removed (or its oxide to be reduced) as described with reference to FIGS. 1A-1D.

For at least one embodiment, the plasma 372 is generated using a power of approximately 0.2 KW to 10 KW. For further embodiments, the plasma 372 is generated using a power of approximately 3 KW to 5 KW. For still further embodiments, the plasma 372 is generated using a power of approximately 4 KW. For at least one embodiment, exposure times for each cycle of 10-200 seconds are used. For further embodiments, exposure times for each cycle of 20-80 seconds are used. The exposure time for one stage of a cycle, e.g., the oxidizing stage, does not have to equal the exposure time for the other stage of a cycle, e.g., the reducing stage. For example, a cycle of 65 seconds might include exposing the semiconductor structure 364 to an oxidizing environment for 35 seconds and exposing the semiconductor structure 364 to a reducing environment for 30 seconds. Other ratios of oxidizing stage exposure times to reducing stage exposure times are possible. The pressure of the chamber 366 during the oxidizing and reducing stages may be less than to slightly above atmospheric pressure for one or more embodiments. For example, the pressure of the chamber 366 may be 200-6000 mTorr. However, other pressures may be used provided the metal to be removed has at least one oxidation state that is volatile at the chosen pressure.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of removing metal from a portion of a substrate, the method comprising:
   exposing the substrate to a reducing environment comprising at least one reducing agent and at least one oxidizing agent;
   determining whether metal remaining on the portion of the substrate is less than or equal to a particular level;
   if the metal remaining on the portion of the substrate is deemed to be greater than the particular level, exposing the substrate to an oxidizing environment comprising at least one oxidizing agent and at least one reducing agent.

2. The method of claim 1, wherein the reducing environment is a reducing plasma and the oxidizing environment is a first oxidizing plasma, the method further comprising:
   exposing the substrate to a second oxidizing plasma comprising at least one oxidizing agent and at least one reducing agent prior to exposing the substrate to the reducing plasma and prior to determining whether the metal remaining on the portion of the substrate is less than or equal to the particular level; and
   if the metal remaining on the portion of the substrate is deemed to be greater than the particular level, exposing the substrate to a second reducing plasma comprising at least one reducing agent and at least one oxidizing agent subsequent to exposing the substrate to the first oxidizing plasma.

3. The method of claim 1, wherein the reducing environment is a first reducing environment and the oxidizing environment is a first oxidizing environment, and wherein determining whether the metal remaining on the portion of the substrate after exposing the substrate to the first reducing environment is less than or equal to the particular level occurs prior to exposing the substrate to the first oxidizing environment, the method further comprising:

after exposing the substrate to the first oxidizing environment, exposing the substrate to a second reducing environment comprising at least one reducing agent and at least one oxidizing agent;

after exposing the substrate to the second reducing environment, determining whether the metal remaining on the portion of the substrate is less than or equal to the particular level; and if the metal remaining on the portion of the substrate after exposure to the second reducing environment is deemed to be greater than the particular level, exposing the substrate to a second oxidizing environment comprising at least one oxidizing agent and at least one reducing agent.

4. The method of claim 3, further comprising:

repeating cycles of exposing the substrate to additional reducing environments and additional oxidizing environments until it is determined, between exposing the substrate to the additional reducing environment of a particular cycle and exposing the substrate to the additional oxidizing environment of the particular cycle, that the metal remaining on the portion of the substrate is less than or equal to the particular level.

5. The method of claim 4, wherein determining whether the metal remaining on the portion of the substrate is less than or equal to the particular level comprises a method selected from a group consisting of determining whether the portion of the substrate has been exposed to an oxidizing environment for a particular number of exposures, determining whether the portion of the substrate has been exposed to an oxidizing environment for a particular amount of total exposure time, and determining whether the portion of the substrate has been exposed to an oxidizing environment for at least a particular number of times and for a particular amount of total exposure time.

6. The method of claim 1, wherein determining whether the metal remaining on the portion of the substrate is less than or equal to the particular level comprises determining whether the metal remaining on the portion of the substrate is deemed to be acceptable for proper operation of an integrated circuit device under formation.

7. The method of claim 1, wherein determining whether the metal remaining on the portion of the substrate is less than or equal to the particular level comprises determining whether the metal remaining on the portion of the substrate is less than or equal to 1E10 atoms/cm$^2$.

8. The method of claim 1, wherein exposing the substrate to the reducing environment comprises exposing the substrate to a reducing environment comprising 20-98% ammonia and 2-65% by volume oxygen.

9. The method of claim 1, wherein exposing the substrate to the reducing environment comprises exposing the substrate to a reducing environment consisting essentially of ammonia and oxygen.

10. The method of claim 1, wherein exposing the substrate to the oxidizing environment comprises exposing the substrate to an oxidizing environment comprising 60-99% oxygen and 0.4-20% by volume hydrogen.

11. The method of claim 1, wherein exposing the substrate to the oxidizing environment further comprises exposing the substrate to an oxidizing environment comprising an inert gas.

12. The method of claim 1, wherein exposing the substrate to the oxidizing environment comprises exposing the substrate to an oxidizing environment consisting essentially of oxygen, hydrogen and nitrogen.

13. A method of removing metal from a portion of a substrate, the method comprising:

exposing the substrate to a first reducing environment comprising at least one reducing agent and at least one oxidizing agent;

after exposing the substrate to the first reducing environment, determining whether metal remaining on the portion of the substrate is less than or equal to a particular level;

if the metal remaining on the portion of the substrate after exposure to the first reducing environment is deemed to be greater than the particular level, exposing the substrate to a first oxidizing environment comprising at least one oxidizing agent and at least one reducing agent;

after exposing the substrate to the first oxidizing environment, exposing the substrate to a second reducing environment comprising at least one reducing agent and at least one oxidizing agent;

after exposing the substrate to the second reducing environment, determining whether the metal remaining on the portion of the substrate is less than or equal to the particular level; and if the metal remaining on the portion of the substrate after exposure to the second reducing environment is deemed to be greater than the particular level, exposing the substrate to a second oxidizing environment comprising at least one oxidizing agent and at least one reducing agent.

14. The method of claim 13, wherein an exposure time for exposing the substrate to the first or second reducing environment is different than an exposure time for exposing the substrate to the first or second oxidizing environment, respectively.

15. The method of claim 13, wherein removing metal comprises removing a metal selected from a group consisting of ruthenium, osmium and iridium.

16. The method of claim 13, wherein exposing the substrate to the first and second reducing environments each comprising at least one reducing agent and at least one oxidizing agent, and exposing the substrate to the first and second oxidizing environments each comprising at least one oxidizing agent and at least one reducing agent, comprises exposing the substrate to reducing agents selected from a group consisting of gases comprising elemental hydrogen, and exposing the substrate to oxidizing agents selected from a group consisting of gases comprising elemental oxygen and gases comprising halogens.

17. The method of claim 13, wherein exposing the substrate to a reducing environment comprises exposing the substrate to a reducing environment comprising ammonia and oxygen.

18. The method of claim 13, wherein exposing the substrate to an oxidizing environment comprises exposing the substrate to an oxidizing environment comprising oxygen and hydrogen.

19. A method of removing metal from a portion of a substrate, the method comprising:

exposing the substrate to a first reducing plasma comprising at least one reducing agent and at least one oxidizing agent;

after exposing the substrate to the first reducing plasma, determining whether metal remaining on the portion of the substrate is less than or equal to a particular level;

if the metal remaining on the portion of the substrate after exposure to the first reducing plasma is deemed to be greater than the particular level, exposing the substrate to a first oxidizing plasma comprising at least one oxidizing agent and at least one reducing agent;

after exposing the substrate to the first oxidizing plasma, exposing the substrate to a second reducing plasma comprising at least one reducing agent and at least one oxidizing agent;

after exposing the substrate to the second reducing plasma, determining whether the metal remaining on the portion of the substrate is less than or equal to the particular level; and if the metal remaining on the portion of the substrate after exposure to the second reducing plasma is deemed to be greater than the particular level, exposing the substrate to a second oxidizing plasma comprising at least one oxidizing agent and at least one reducing agent.

20. The method of claim 19, wherein exposing the substrate to the first reducing plasma comprises exposing the substrate to a reducing plasma comprising ammonia and oxygen, and wherein exposing the substrate to the first oxidizing plasma comprises exposing the substrate to an oxidizing plasma comprising oxygen and hydrogen.

* * * * *

UNITED STATES PATENT AND TRADEMARK OFFICE
CERTIFICATE OF CORRECTION

PATENT NO. : 10,453,673 B2  
APPLICATION NO. : 15/867993  
DATED : October 22, 2019  
INVENTOR(S) : Dolan et al.

Page 1 of 1

It is certified that error appears in the above-identified patent and that said Letters Patent is hereby corrected as shown below:

In the Claims

Column 9, Claim 8, Line 52, delete "comprising 20-98% ammonia" and insert in place thereof -- comprising 20-98% by volume ammonia --.

Column 9, Claim 10, Line 60, delete "comprising 60-99% oxygen" and insert in place thereof -- comprising 60-99% by volume oxygen --.

Signed and Sealed this  
Seventeenth Day of March, 2020

Andrei Iancu  
*Director of the United States Patent and Trademark Office*